United States Patent [19]

Hirano et al.

[11] Patent Number: 5,370,077
[45] Date of Patent: Dec. 6, 1994

[54] SINGLE CRYSTAL ROD PULL-UP GROWING APPARATUS

[75] Inventors: Yoshihiro Hirano; Atsushi Ozaki, both of Annaka; Masahiko Urano, Takasaki, all of Japan

[73] Assignee: Shin-Etsu Handotai Company, Limited, Tokyo, Japan

[21] Appl. No.: 933,375

[22] Filed: Aug. 24, 1992

[30] Foreign Application Priority Data

Aug. 24, 1991 [JP] Japan ................................. 3-237159

[51] Int. Cl.$^5$ .......................................... C30B 15/20
[52] U.S. Cl. ..................................... 117/201; 117/14; 117/208
[58] Field of Search ............... 156/600, 601, 617.1, 156/618.1, 620.4; 422/248, 249

[56] References Cited

U.S. PATENT DOCUMENTS

| | | | |
|---|---|---|---|
| 3,284,172 | 11/1966 | Binder | 156/601 |
| 3,714,452 | 1/1973 | Williamson | 307/86 |
| 4,384,214 | 5/1983 | Crick et al. | 307/66 |
| 4,686,379 | 8/1987 | Ohnari | 307/66 |
| 4,926,357 | 5/1990 | Katsuoka et al. | 156/601 |
| 5,089,238 | 2/1992 | Araki et al. | 422/249 |
| 5,156,822 | 10/1992 | Whipple, III | 422/248 |

FOREIGN PATENT DOCUMENTS 0183221 4/1986 European Pat. Off. .

OTHER PUBLICATIONS

Patent Abstracts of Japan, vol. 14, No. 270, Jun. 12, 1990, JP-A-20 80 400, Mar. 20, 1990.

*Primary Examiner*—R. Bruce Breneman
*Assistant Examiner*—Felisa Garrett
*Attorney, Agent, or Firm*—Browdy and Neimark

[57] ABSTRACT

The present invention provides control of single crystal growth after the recovery from power failure when controlling crystal growth in an automatic mode. A source voltage is supplied to a controller 70 through a no-break power supply 62. At the time of recovery from power failure, the controller continues the automatic operation mode with the same control output as that stored when power failure is detected (84, 85) if the power failure time t is t $\leq t_1$ (for example, 1 second), switches the control mode to the manual control mode with the same control output as that stored when the power failure is detected (86, 87) if $t_1 < t \leq t_2$ (for example, 5 seconds), stops the crystal growth operation and switches the control mode to the manual control mode (88, 89) if $t_2 < t \leq t_3$ (for example, 600 seconds), and separates the grown crystal from a melt 22 by upwardly moving the crystal and upwardly moves a crucible 16 (90) if $t > t_3$.

11 Claims, 3 Drawing Sheets

SINGLE CRYSTAL ROD PULL-UP GROWING APPARATUS

BACKGROUND OF THE INVENTION

The present invention relates to a single crystal rod pull-up growing apparatus.

FIG. 3 shows the arrangement of a principal portion of a single crystal rod pull-up growing apparatus.

In a chamber 10, a graphite crucible 14 is placed on a table 12, and a quartz crucible 16 is engaged in the graphite crucible 14. The graphite crucible 14 is surrounded by a heater 18 which is surrounded by a heat shield 20. When polycrystal line pieces are placed in the quartz crucible 16, and when electric power is supplied to the heater 18, the polycrystal line pieces are heated to form a melt 22. The upper end of a supporting shaft 24 is secured to the table 12, the supporting shaft 24 being rotated by a motor M1 and vertically driven by a motor M2.

On the other hand, a seed holder 28 is attached to the lower end of a wire 26, a seed crystal 30 being held by the seed holder 28. The wire 26 is rotated around the axis thereof by a motor M3 and wound and unwound by a motor M4. After the seed crystal 30 is downwardly moved and dipped into the melt 22, the seed crystal 30 is pulled up to grow a single crystal rod 32.

In addition, Ar gas is introduced into the chamber 10 through a solenoid valve 34, and the chamber 10 is evacuated through a solenoid valve 36 and a vacuum pump 38.

Modes for controlling single crystal rod growth include an automatic control mode and a manual control mode, and the automatic control mode is generally selected if possible. In the automatic control mode, the temperature of the melt 22, the surface height of the melt 22, the rotational speed of the quartz crucible 16 and the pulling-up speed and rotational speed of the single crystal rod 32 are automatically controlled. In the manual control mode, these conditions are controlled by the skilled operator operating control knobs and switches on a console panel while viewing the crystal growth state.

When the single crystal rod 32 is automatically grown in the automatic control mode, if a commercial power source is cut off, since the heater 18 is turned off, the temperature of the melt 22 decreases, and the single crystal rod 32 cannot be continuously grown depending upon the degree of the power failure. Even if the time of power failure is relatively short, since the speed of response of the melt 22 to temperature control is relatively low, the electricity supplied to the heater 18 is significantly changed when automatic control mode is continued except the term of the power failure. This sometimes makes the temperature of the melt 22 unstable and the growth of the single crystal rod 32 impossible. In a factory provided with many single crystal rod growing apparatuses, although each of the growing apparatuses must be appropriately controlled in a manual control mode after the recovery from power failure, preferable control of the motors M1 to M4 depends upon the power failure time, thereby causing a state of panic. As a result, the rate of success of growth of the single crystal rod 32 is decreased, and the production cost is increased.

SUMMARY OF THE INVENTION

In consideration of the above problems, it is an object of the present invention to provide a single crystal rod pull-up growing apparatus which is capable of appropriately controlling the growth of a single crystal rod after the recovery from power failure when controlling in an automatic mode.

In order to achieve the object, the present invention provides a single crystal rod pull-up growing apparatus for growing a single crystal rod by pulling up a seed crystal dipped in a melt in a rotating crucible surrounded by a heater while rotating the seed crystal around the axis thereof. The growing apparatus comprises a no-break power supply which supplies the input commercial AC source voltage to an inverter after rectification to output an AC source voltage with stabilized voltage when the commercial AC power source is input, and which supplies the output voltage of a battery to the inverter to output an AC source voltage when the input of the commercial source voltage tails; a power failure detection circuit for detecting the supply of the commercial AC source voltage to the input of the power supply has failed; means for measuring the power failure time from the detection of power failure to the recovery from power failure; and a controller for controlling the rotation of the crucible, the rotation of the single crystal rod around the axis and pulling-up of the single crystal rod for growing the single crystal rod. The controller has an automatic control mode and a manual control mode, is operated by the AC source voltage supplied from the no-break power supply, stores the control output when power failure is detected, stops control during the time power failure is detected, and starts control in the automatic control mode with the same control output as that stored at the time of recovery from power failure if the control mode of the controller before the detection of power failure is the automatic control mode and the measured power failure time is less than a set time $t_1$.

The set time $t_1$ is an upper limit time which allows power failure to be ignored. It is found from the experiment that the preferred set time $t_1$ is in the range of 0.05 to 2 seconds. In the present invention, since the automatic control mode is continued with the control output equal to the output at the start of power failure, the control output becomes uninterrupted and thus permits the continuation of the stable control, thereby increasing the rate of success of crystal growth.

In a first aspect of the present invention, the controller resumes the control by switching the control mode to the manual control mode with the same control output as that stored if the control mode of the controller is the automatic control mode before a power failure is detected and the measured power failure time is within the range of the set time $T_1$ to a set time $t_2$ at the time of recovery from power failure.

The set time $t_2$ is an upper limit time which permits the crystal growth to be continued by a skilled operator in the manual control mode under crystal growth conditions which are slightly deviated from the conditions at the start of power failure. It is found from the experiment that the preferred set time $t_2$ is in the range of 2 to 10 seconds. In this first aspect, since the control output is the same as that stored when power failure is detected, the control output becomes uninterrupted and thus permits the continuation of stable control.

If the automatic mode is continued with this power failure time, large hunting occurs in the electric power supplied to the heater due to the relatively low responsibility of the melt temperature to the heater control, and crystal growth cannot be thus continued. However, when the crystal growth is controlled with viewing the growing crystal by the skilled operator in the manual control mode, the rate of success of crystal growth can be increased, as compared with the case of the automatic mode.

In a second aspect of the present invention, the controller leaves the control to stop and switches the control mode to the manual mode at the time of recovery from power failure if the control mode of the controller is the automatic control mode before power failure is detected and the measured power failure time is within the range of the set time $t_2$ to a set time $t_3$.

When the power failure time is greater than the set time $t_2$, since the crystal growth conditions are significantly deviated from the conditions at the start of power failure, the crystal growth cannot be easily resumed. However, there is the possibility that the crystal growth succeeds when the control is left to the decision by the skilled operator. The set time $t_3$ is an upper limit time which allows the above possibility to be recognized. It is found from the experiment that the preferred set time $t_3$ is in the range of 300 to 1,200 seconds.

With this power failure time, since the crystal growth conditions are significantly deviated from the conditions at the start of power failure, when the crystal growth operation is intentionally stopped at the time of recovery from power failure, manual control can be more easily performed as compared with the case where crystal growth is restarted from the control state at the start of power failure, and the rate of success of crystal growth can thus be increased.

In a third aspect of the present invention, the controller separates the grown crystal from the melt by pulling the crystal up and upwardly shifts the crucible in order to separate the crucible from the heater if the control mode of the controller is the automatic control mode before the power failure is detected and the measured power failure time is greater than the set time $t_3$.

If $t > t_3$, there is little hope of success of crystal growth. In this third aspect, it is possible to prevent the phenomenon that the single crystal rod cannot be separated from the melt due to solidification of the melt, and to prevent the heater from being damaged due to the breakage of the crucible, which is caused by the large thermal stress interior of the crucible when the melt is solidified.

DESCRIPTION OF PREFERRED EMBODIMENTS OF THE INVENTION

An embodiment of the present invention is described below with reference to the drawings.

Figure 2:
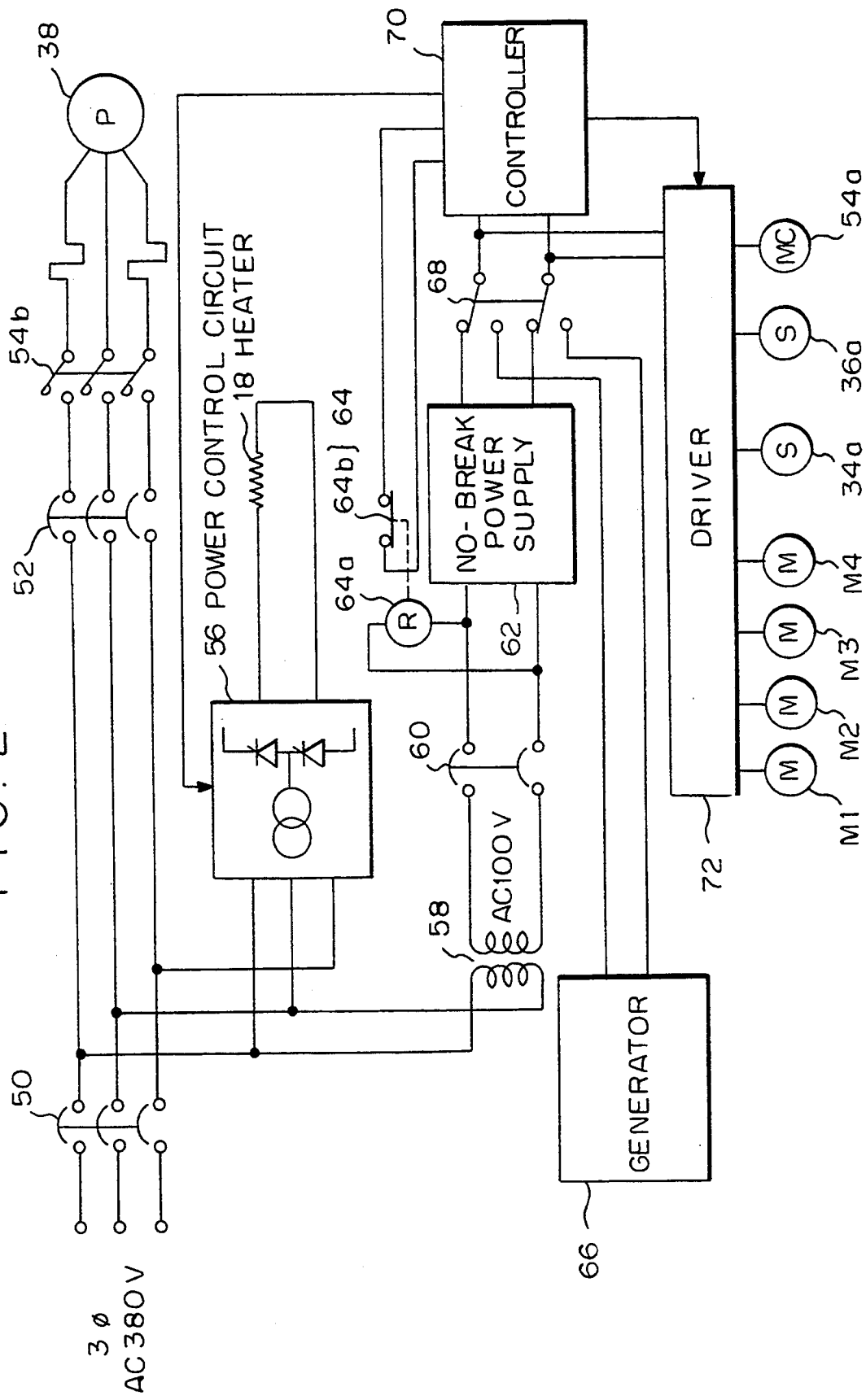
FIG. 2 is a block diagram showing the hardware of a controller for single crystal pull-up growth of the crystal growing apparatus shown in FIG. 3.
Figure 3:
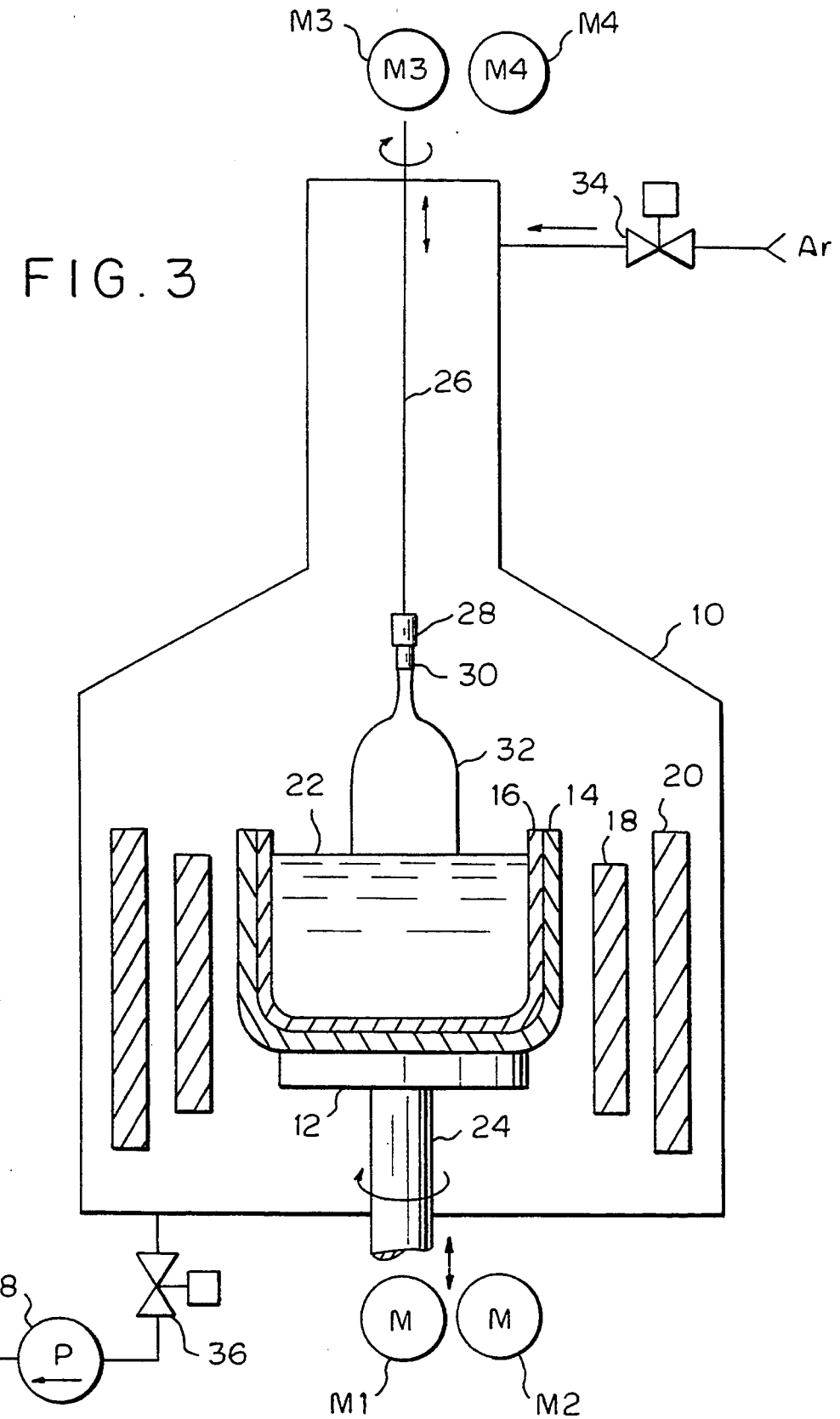
FIG. 3 is a block diagram showing a principal portion of the single crystal pull-up growing apparatus.

FIG. 2 shows the arrangement of a single crystal rod pull-up growing controller. This controller functions to control the single crystal pull-up growing apparatus shown in FIG. 3.

For example, a commercial power source of three-phase AC 380 V is supplied to a vacuum pump 38 through wiring breakers 50, 52 and main contacts 54b of electromagnetic contactors, and is supplied to the source voltage input terminal of a power control circuit 56 and the primary side coil of a voltage decreasing transformer 58 in parallel. A heater 18 is connected to the output terminal of the power control circuit 56 so that the power control circuit 56 supplies electric power to the heater 18 on the basis of the control signal output from a controller 70.

A voltage of AC 100 V is produced in the secondary side coil of the voltage decreasing transformer 58. This voltage is supplied to the input terminal of a no-break power supply 62 and the electromagnetic coil 64a of a power failure detection relay 64 in parallel through a wiring breaker 60. The voltage output terminal of the no-break power supply 62 and the voltage output terminal of a generator 66 are connected to the source voltage input terminals of the controller 70 and a driver 72 through a change-over switch 68, which is manually operated, so that one of the output voltage of the no-break power supply 62 and the output voltage of the generator 66 is selectively supplied to the controller 70 and the driver 72. The no-break power supply 62 usually supplies a commercial power source to an inverter after rectification to output an AC voltage with stabilized voltage and frequency. When the voltage input to the no-break power supply 62 is less than a predetermined voltage, the no-break power supply 62 immediately supplies the output voltage of the battery contained therein. When the input voltage is recovered from a power failure state, the output voltage of the battery is switched to the DC voltage obtained by rectifying the commercial power source. This operation permits the output voltage of the no-break power supply 62 to be kept in a no-break state.

The controller 70 is provided with an automatic control mode and a manual control mode. In the automatic mode, the temperature of a melt 22, the surface height of the melt 22, the rotational speed of a quartz crucible 16, and the pulling-up speed and rotational speed of a single crystal rod 32 are automatically controlled. In the manual model the above conditions are controlled by a skilled operator using the operating handles and switches on a console panel (not shown) connected to the controller 70 while visually observing the growth state of the crystal rod 32.

Figure 1:
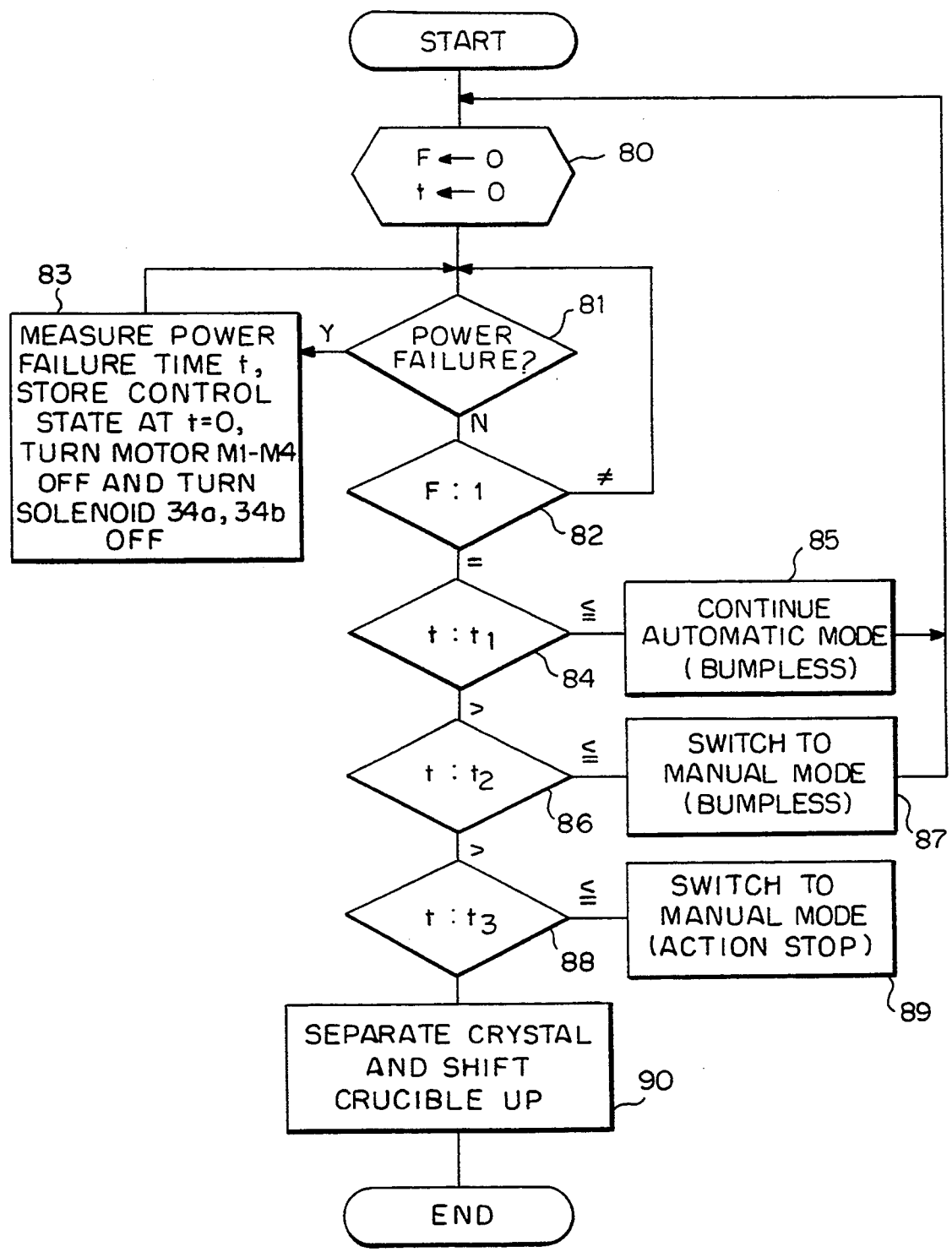
FIG. 1 is a flow chart showing the processing performed by a controller at the time of power failure.

The controller 70 is also provided with a microcomputer or a sequencer so as to execute the processing shown in FIG. 1 in the case of power failure. The parenthesized numerical values below respectively show the identification numbers of the steps shown in FIG. 1.

(80) A power failure flag F is reset, and the power failure time t is cleared to zero.

(81) A decision is made on the basis of the signal of the b contact 64b whether or not electrical power fails.

(82) If electrical power does not fail, i.e., if the b contact 64b is turned off, a decision is made as to whether or not the power failure flag F is set. If the power failure flag F is reset, the flow returns to the Step 81.

(83) If it is decided in Step 81 that electrical power fails, the power failure time t is measured, and the power failure flag F is set. In addition, the total control output at the start of power failure t=0 is stored. During power failure, since no electrical power is supplied to the power control circuit 56 and the vacuum pump 38, and since the heater 18 which consumes relatively large electrical power and the vacuum pump 38 are put into an inoperative state, the controller 70 stops the rotation of motors M1 to M4 through the driver 72 and demagnetizes solenoids 34a and 36a so as to close solenoid valves 34 and 36.

At the time of recovery from power failure, the power control circuit 56 is put into an operative state, and the flow moves to Step 84 through Steps 81 and 82.

(84) A decision is made as to whether or not the power failure time t is less than a set time $t_1$. The set time $t_1$ is an upper limit time which makes power failure negligible. It is found from experiment that the preferred set time $t_1$ is in the range of 0.05 to 2 seconds.

(85) If $t \leq t_1$, the automatic mode is continued with the control output stored at the start of power failure. This makes the control output bumpless and thus enables the continuation of stable control. The flow then returns to Step 80.

(86) When the power failure time t is greater than the set time $t_1$, a decision is made as to whether or not the power failure time t is less than a set time $t_2$. The set time $t_2$ is an upper limit time which allows the skilled operator to continue the crystal growth in the manual mode under crystal growth conditions which are slightly deviated from the conditions at the start of power failure $t=0$. It was found from experiment that the preferred set time $t_2$ is in the range of 2 to 10 seconds.

(87) If $t_1 < t \leq t_2$, the control mode is switched from the automatic mode to the manual mode. In this case, since the control output is the same as that stored at the start of power failure $t=0$, the control output is made bumpless.

If the automatic mode is continued with the above power failure time t, large hunting occurs in the power supplied to the heater 18 due to the relatively low responsibility of the melt 22 to temperature control, and the crystal growth cannot be controlled. However, when the crystal growth is controlled by the skilled operator in the manual mode while visually observing, the rate of success of crystal growth can be increased, as compared with the case of the automatic mode.

If the control is then stabilized, the operator switches the control mode to the automatic mode. When the control mode is switched to the automatic mode, the flow returns to Step 80.

(88) If the power failure time t is greater than the set time $t_2$, a decision is made as to whether or not the power failure time t is less than a set time $t_3$.

If the power failure time t is greater than the set time $t_2$, since the crystal growth conditions are significantly deviated from the conditions at the start of power failure $t=0$, the crystal growth cannot be easily resumed. However, there is the possibility that the crystal growth succeeds. The set time $t_3$ is an upper limit time which allows the possibility to be recognized. It was found from experiment that the preferred set time $t_3$ is in the range of 300 to 1,200 seconds.

(89) If $t_2 < t \leq t_3$, the control mode is switched to the manual mode, the rotation of the motors M1 to M4 is stopped, the amount of the power supplied to the heater 18 is set to the value of in an initial stage of crystal growth, and the control of the growth conditions is left to the decision by the skilled operator. This is because the crystal growth conditions are significantly deviated from the conditions at the start of power failure $t=0$, and thus the manual control cannot be easily performed when the control is restarted from the control state at the start of power failure.

(90) If $t > t_3$, there is little hope of success of crystal growth. In this case, in order to prevent the phenomenon that the single crystal rod 32 cannot be separated from the melt 22 due to solidification of the melt 22, a wire 26 is wound up at high speed so that the single crystal ord 32 is separated from the melt 22. In addition, the support shaft 24 is upwardly moved to a limit position in order to prevent the heater 18 from being damaged by the breakage of the quartz crucible 16 and the graphite crucible 14, which is caused by the thermal stress applied to the quartz crucible 16 when the melt 22 is solidified.

As described above, appropriate processing is performed after the recovery from power failure in accordance with the power failure time t, whereby the rate of success of crystal growth can be increased, and the production cost of a single crystal can be decreased.

When the above processing cannot be performed due to a trouble of the battery contained in the no-break power supply or the like, if the power failure time t is $t > t_3$, and if the single crystal rod 32 must be separated from the melt 22, the operator operates the change-over switch 68 so that the output voltage of the generator 66 provided in a factory is supplied to the controller 70 and the driver 72 for performing the separating work.

What is claimed:

1. An apparatus for melt drawing a single crystal by dipping a seed crystal into a melt in a rotating crucible surrounded by a heater and pulling up the seed crystal while rotating it around an axis thereof, said apparatus comprising:

a no-break power supply to supply input voltage to an inverter after rectification to output an AC source voltage with stabilized voltage when a commercial AC source voltage is input, and which supplied the output voltage of a battery to said inverter to output an AC source voltage when the input of said source voltage fails;

a power failure detection circuit for detecting when the supply of said commercial AC source voltage to the input of said power supply fails;

means for measuring the length of time of failure of the power supply, said measuring comprising the time from the detection of the power failure to recovery from the power failure; and a controller for controlling the rotation of the crucible, the rotation of said single crystal rod around its axis and drawing said single crystal for growing said single crystal rod, said controller having an automatic control mode and a manual control mode, said controller operated by said AC source voltage supplied from said no-break power supply, storing the control output when said power failure is detected, stopping the control during the detection of said power failure, and resuming the control in said automatic control mode with the same control output as that stored at the time of recovery from the power failure if said control mode before the detection of the power failure is in automatic control mode and the measured power failure time is less than a time $t_1$;

said controller resumes control by switching said control mode to said manual control mode with the same control output as that stored at the time of recovery from the power failure if said control mode of the controller is in the automatic control mode before the power failure is detected and said measured power failure time is within the range of times $t_1$ to $t_2$; and said controller leaves said control to stop and switches said control mode to said manual control mode at the time of recovery from power failure if said control mode of said controller is automatic control mode before said power failure is detected and said measured power failure time is within the range of said time $t_2$ to time $t_3$.

2. An apparatus according to claim 1, wherein said controller (70) separates the grown crystal from said melt by upwardly moving said grown crystal and upwardly shifts said crucible (16) in order to separate said crucible from said heater (18) if said control mode of said controller is said automatic control mode before said power failure is detected and said measured power failure time is greater than said set time $t_3$.

3. The apparatus according to claim 2 wherein said predetermined time $t_1$ ranges from 0.05 to 2 seconds;

said time $t_2$ ranges from 2 to 10 seconds; and said time $t_3$ ranges from 300 to 1200 seconds.

4. The apparatus according to claim 1 wherein said time $t_1$ ranges from 0.05 to 2 seconds;

said time $t_2$ ranges from 2 to 10 seconds; and said predetermined time $t_3$ ranges from 300 to 1200 seconds.

5. In an apparatus for melt drawing a monocrystalline rod comprising a rotating crucible surrounded by a heater and means for pulling a seed crystal while rotating the crucible, the improvement comprising:

a power failure detection circuit for detecting a failure in supply of power from a source voltage to the apparatus;

means for measuring the length of time of the power failure;

a controller for controlling the rotation of the crucible, the rotation of the single crystal rod around its axis, said controller having an automatic control mode and a manual control mode, said controller being operated by a source voltage supplied from said no-break power supply, said controller storing the control output when a power failure is detected, means no stop the control during the power failure, and means to resume control in automatic control mode with the same control output as a control output stored in the controller at the time the mower failure ends before a time $t_1$.

6. The apparatus according to claim 5 wherein said controller resumes said control by switching said control mode to a manual control mode with the same control output as that stored at the time of recovery from a power failure if the control mode of the controller is automatic control mode before detection of the power failure, and the time of the power failure is within the range of $t_1$ to times $t_2$.

7. The apparatus according to claim 6 wherein said controller switches the control mode to manual control mode at the time of recovery from a power failure if the control mode of the controller is in automatic control mode before detection of a power failure, and the length of time of the power failure is within the range of from 300 to 1200 seconds.

8. The apparatus according to claim 7 wherein said time $t_1$ ranges from 0.05 to 2 seconds.

9. The apparatus according to claim 8 wherein said time $t_2$ ranges from 2 to 10 seconds.

10. In a method for melt drawing a monocrystalline rod comprising pulling a seed crystal from a rotating crucible surrounded by a heater while rotating the crucible, the improvement comprising:

providing means to detect a failure in the power supply to the heater and controller means for controlling the rotation of the crucible, said controller means having an automatic control mode and a manual control mode;

measuring the length of time of a power failure;

and if the length of time of a power failure is $t_1$, ignoring the power failure;

if the length of time of a power failure is between $t_2$ and $t_3$, switching control of the controller means from automatic to manual control; and if the length of time of a power failure is greater than $t_3$, stopping the melt drawing.

11. The method according to claim 10 wherein $t_1$ is from 0.05 to 2 seconds; $t_2$ is from 2 to 10 seconds, and $t_3$ is from 300 to 1200 seconds.

* * * * *